US006794623B2

United States Patent
Shi et al.

(10) Patent No.: US 6,794,623 B2
(45) Date of Patent: Sep. 21, 2004

(54) GUIDED HEATING APPARATUS AND METHOD FOR USING THE SAME

(75) Inventors: Song-Hua Shi, Phoenix, AZ (US); Bob Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 173 days.

(21) Appl. No.: 10/002,893

(22) Filed: Nov. 14, 2001

(65) Prior Publication Data

US 2003/0089705 A1 May 15, 2003

(51) Int. Cl.⁷ .................................................. H05B 6/80
(52) U.S. Cl. ........................................ 219/685; 219/756
(58) Field of Search ................................. 219/685, 756, 219/739, 759, 762, 681, 400, 392, 705, 708, 690, 502, 121.43; 438/463, 16, 482; 118/723 AN, 723 MW, 723 MA, 723 ME, 50.1; 156/345.42

(56) References Cited

U.S. PATENT DOCUMENTS 5,698,036 A * 12/1997 Ishii et al. .......... 118/723 MW
6,347,602 B2 * 2/2002 Goto et al. .......... 118/723 MW
6,431,114 B1 * 8/2002 Imahashi et al. ... 118/723 MW

* cited by examiner

Primary Examiner—Quang T. Van
(74) Attorney, Agent, or Firm—Blakely, Sokoloff, Taylor & Zafman LLP

(57) ABSTRACT

A guided heating apparatus and a method for using the same is provided. The apparatus includes a guiding enclosure, a supporting piece, and an absorbing piece. The guiding enclosure guides and keeps energy from an energy source within the guiding enclosure. The guiding enclosure is made of a material reflective of the energy. The energy source is either one of a microwave source and an infrared source. The supporting piece is detachably coupled with the guiding enclosure and is made of a material transparent to the energy. The absorbing piece is coupled to and supported by the supporting piece within the guiding enclosure. The absorbing piece is made of at least one material that absorbs the energy and transfers the energy to an object to be heated. The absorbing piece has a predetermined composition that controls an energy absorption rate of the absorbing piece.

16 Claims, 7 Drawing Sheets

GUIDED HEATING APPARATUS AND METHOD FOR USING THE SAME

FIELD OF THE INVENTION

The present invention relates generally to the field of microwave and infrared heating and, more particularly, to a guided heating apparatus.

BACKGROUND

Current technology exists for using microwave and infrared radiation to heat objects to a desired temperature. Infrared radiation may not be used in conjunction with microwave radiation to heat target objects simultaneously. Infrared radiation lies between the visible and microwave portions of the electromagnetic spectrum Thus infrared waves have wavelengths longer than visible and shorter than microwaves and have frequencies which are lower than visible and higher than microwaves.

Devices exist currently that provide either an infrared energy source or a microwave energy source to direct infrared or microwave energy at target objects to be heated. Generally, this is done in a chamber having an energy source. All the objects enclosed within the chamber are exposed within a certain amount of time to microwave or infrared energy, thereby heating the objects.

One particular issue that arises from this type of device is the amount of energy wasted in heating objects in the chamber other than the target objects. In many instances, target objects may be fastened or coupled to components that are not susceptible to microwave or infrared energy. In another scenario, these components may be more susceptible to microwave or infrared energy and absorb the energy meant for the target objects. Other related problems that arise from the approach mentioned above are undesired overheating of target objects and undesired underheating of target objects.

BRIEF DESCRIPTION OF THE DRAWINGS

The present invention is illustrated by way of example, and not limitation, in the figures of the accompanying drawings in which.

DETAILED DESCRIPTION

A guided heating apparatus and a method for using the same are described. In the following detailed description of the present invention, numerous specific details are set forth in order to provide a thorough understanding of the present invention. However, it will be apparent to one skilled in the art that the present invention may be practiced without these specific details. In some instances, well-known structures and devices are shown in block diagram form, rather than in detail, in order to avoid obscuring the present invention. There are several different ways to implement an independent positioning system. Several embodiments are described herein. However, there are other ways that would be apparent to one skilled in the art that may be practiced without specific details.

Figure 1:
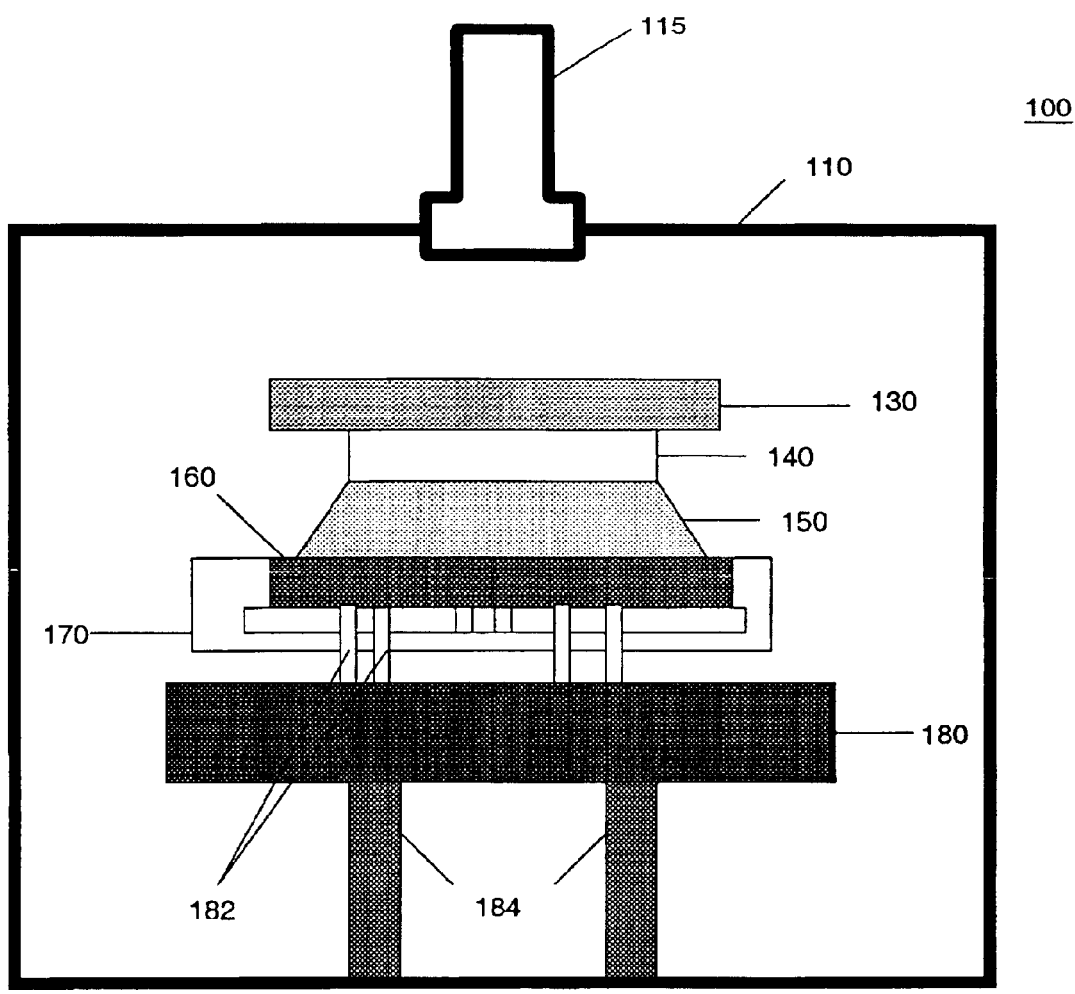
FIG. 1 is a cross-sectional side view of one embodiment of a heating apparatus.

FIG. 1 illustrates one embodiment of a heating apparatus 100. The heating apparatus includes a chamber 110 having an energy source 115. Energy from the energy source 115 flows into the chamber 110 to heat one or more target objects. Generally, this type of apparatus may be used in processes involving integrated circuit chips. One example is the curing of materials such as encapsulants, adhesives used as cavity fills in integrated circuits, underfill material, and solder materials.

As seen in FIG. 1, energy from the energy source 115 is dispersed throughout the chamber 110. A portion of the energy from the energy source 115 flows to heat a heating block 130. The heating block 130 is generally made of a thermally conductive material such as silicon and microwave absorbing ceramics. This allows the heating block to heat up more quickly from the energy than other elements present in the chamber.

The heat then travels conductively through the heating block 130 to an integrated circuit (IC) chip 140 below. Target material to be heated, underfill material 150 in FIG. 1, is sandwiched between the IC chip 140 and a substrate 160. Another portion of the energy from the energy source 115 travels directly to heat the underfill material 150 and substrate 160.

A problem with the heating apparatus shown in FIG. 1 is that portions of the energy from the energy source 115 do not solely heat the object to be heated. Rather, the energy flows throughout the entire chamber 110. As a result, the energy heats other elements in the chamber such as the substrate holder 170, package metal pins 182 that stand on a sample stage 180, the sample stage 180, and sample stage supports 184. In particular, elements such as the package metal pins 182 tend to heat up far quicker than elements such as the underfill material 160 due to the eddy current on the metal pins 182. Since the underfill material 160 is actually the target object to be heated in the heating apparatus 100, the fact that these other elements heat faster poses a problem.

Another problem with the heating apparatus shown in FIG. 1 relates to the heating block 130. The heating block 130 is generally made of one material that uniformly generates the heat from one area of the heating block 130 to another area of the heating block and then to the object. This is unsatisfactory if there is more than one object to be heated or the object to be heated requires different concentrations of the energy to heat particular portions of the object (or objects) for varying time periods.

Figure 2:
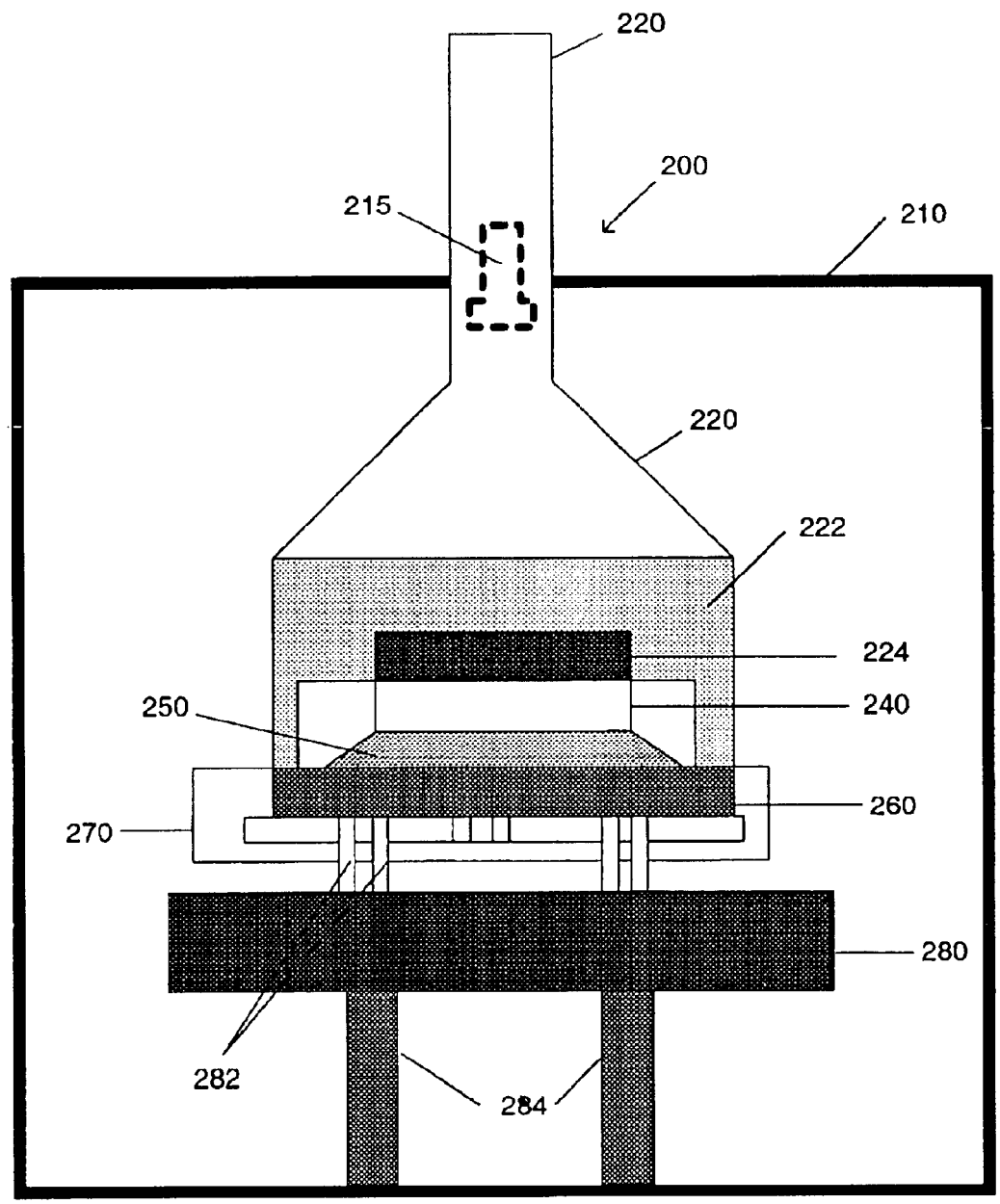
FIG. 2 is a cross-sectional side view of one embodiment of a guided heating apparatus.

FIG. 2 illustrates a guided heating apparatus 200 according to an embodiment of the invention. The guided heating apparatus 200 includes a chamber 210 having an energy source 215. The energy source is enclosed by a guiding enclosure 220 that guides and keeps energy from the energy source 215 within the guiding enclosure 220. The introduction of the guiding enclosure 220 prevents the dissemination of energy throughout the entirety of the chamber 210 thereby causing elements such as the sample holder 270, package metal pins 282, sample stage 280, and sample stage supports 284 from becoming unnecessarily heated from the energy. Rather, the guiding enclosure 220 guides the energy to a target area.

The guiding enclosure 220 is coupled to a supporting piece 222. In one embodiment, depending on the energy source and the material of the heating object(s), there may or may not be an absorbing piece 224 inside the guiding enclosure 220. If the absorbing piece is needed, the absorbing piece 224 is secured and supported by the supporting piece 222 within the guiding enclosure 220. Any number of objects may be heated directly or indirectly by being placed in the guiding enclosure 220 so that the energy from the energy source 215 is guided toward that object(s). Depending on the energy source and the size of the object to be heated, there may be surface areas of the object that are directly exposed to the energy. In addition, the object may be positioned and aligned with the absorbing piece 224 such that the absorbing piece transfers the energy it absorbed from the energy source to the object. This type of scenario occurs when the absorbing piece is made of one or more materials that may absorb energy faster than the object.

In FIG. 2, the object to be heated is underfill material 250 sandwiched between an IC chip 240 and a substrate 260. In this type of application, the absorbing material absorbs the energy very quickly, and transfers the energy to the IC chip 240 The IC chip 240 then conducts the energy to the underfill material 250. At the same time, the side surfaces of the underfill material 250 will receive energy directly.

This type of guided heating apparatus 200 avoids heating other elements and provides greater control of heat towards an object to be heated. One particular application where such a guided heating apparatus may be useful is a no flow underfill application. This type of application is discussed in more detail with reference to FIGS. 4a–4c.

Figure 3:
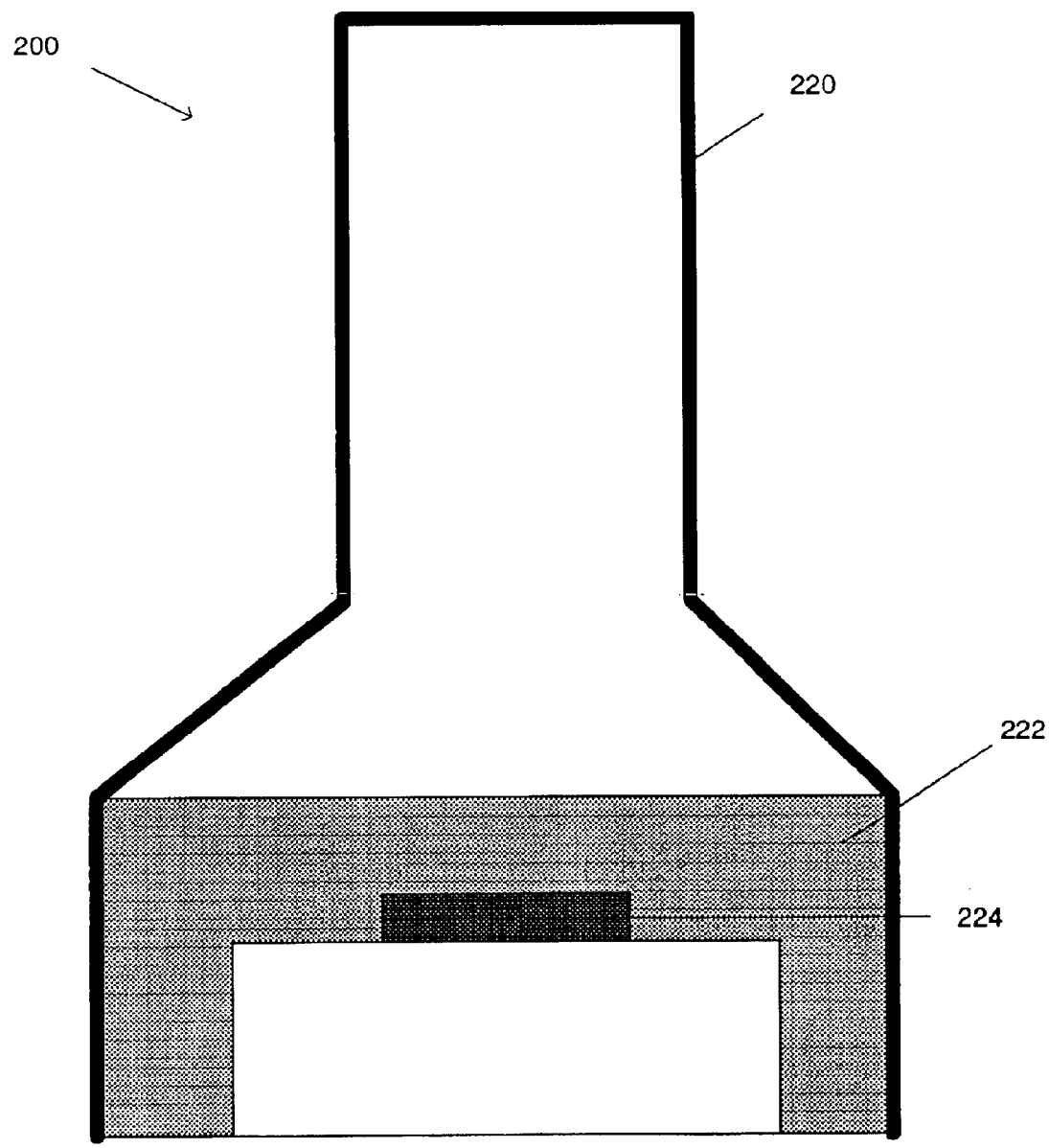
FIG. 3 is an enlarged cross-sectional side view of the embodiment shown in FIG. 2.

FIG. 3 illustrates an enlarged view of the embodiment shown in FIG. 2. In FIG. 3, a guiding enclosure 220, a supporting piece 222, and an absorbing piece 224 are shown. As discussed in reference to FIG. 2, an energy source provides energy that is guided and confined within the guiding enclosure 220.

In one embodiment, the energy source may be a microwave source that emits microwave energy. Microwave radiation is one kind of electromagnetic wave whose propogation property is similar to any other electromagnetic waves.

In an alternative embodiment, the energy source may be an infrared source that emits infrared energy. Infrared waves generally have wavelengths shorter than microwaves and frequencies that are higher than microwaves.

Irrelevant of which type of energy source is used in the guided heating apparatus 200, there may be any of three interactions between the energy and other materials present within the guided heating apparatus 200. The first interaction involves materials that reflect the majority of the energy rather than absorb or transmit it. The second interaction involves materials that behave in a transparent manner thereby transmitting the majority of the energy. The third interaction involves materials that absorb the majority of the energy.

Because microwave energy and infrared energy differ, different materials react in different ways to both types of energy sources. For example, materials that reflect infrared energy will not automatically reflect microwave energy and vice versa. Accordingly, materials chosen for the elements in the guided heating apparatus 200 should cater to the type of energy source present in the chamber.

The guiding enclosure 220 is made of a material reflective of the energy from the energy source. In one embodiment, where the energy is from a microwave source, the guiding enclosure 220 may be made of metal. Some metals that may be used are aluminum, stainless steel, and copper. The thickness of the microwave guide wall may range from 1 micron (coated metal film) to 20 centimeters. In an alternative embodiment, where the energy is from an infrared source, the guiding enclosure 220 may be made of plated gold, aluminum and silver coating, copper, and chromium plating.

A particular structure for the guiding enclosure 220 is shown in FIG. 3. However, the guiding enclosure 220 can take on any shape or size according to different considerations. One consideration may be the size of the energy source 215 enclosed by the guiding enclosure 220. Another consideration may be the size of the chamber 210 or the size of the target area to be heated.

A supporting piece 222 is coupled with the guiding enclosure 220. The supporting piece 222 secures an absorbing piece 224 to an object within the guiding enclosure 220 while transmitting the majority of the energy through the piece 222. The supporting piece 222 may also be any shape or size also according to various considerations. One consideration may involve the size of the absorbing piece 224 and the object or objects to be heated. Another consideration may be the size of the guiding enclosure 220 and how the supporting piece 222 couples to the guiding enclosure 220. In different embodiments, the supporting piece 222 may be placed within or coupled to the guiding enclosure 220 by adhering, bolting, or socking technology.

In one embodiment, where the energy is from a microwave source, the supporting piece 222 may be made of a transparent material such as quartz or microwave transparent ceramic, non-polar polymeric material such as Teflon. In an alternative embodiment, where the energy is from an infrared source, the selection of the material of the supporting piece depends on the infrared radiation source. The supporting piece 222 may be made of transparent materials such as quartz, potassium bromide, or infrared transparent glass such as No. 2540 glass and No. 2550 glass.

The absorbing piece 224 is secured and supported by the supporting piece 222 within the guiding enclosure 220. In different embodiments, the absorbing piece 224 may be adhered, socked, or bolted to the supporting piece 222. The absorbing piece 224 is made of a material that absorbs the majority of the energy rather than transmitting or reflecting it. In alternative embodiments, there may be more than one absorbing piece 224.

The absorbing piece has a predetermined composition that controls an energy absorption rate of the absorbing piece 224. In one embodiment, the absorbing piece 224 may be made of one material so that the absorbing piece 224 uniformly absorbs and transfers the energy. In an alternative embodiment, the absorbing piece 224 may be made of more than one material so that each material is capable of absorbing the energy from the energy source at a different absorption rate. In alternative embodiments, the absorbing piece 224 may be made of one or more materials and additionally have a portion or the whole piece 224 coated by a reflective layer to control the energy absorption rate of the absorbing piece 224.

In one embodiment, where the energy is from a microwave source, the absorbing piece may be made of metal, or carbon doped polymeric material, ion doped polymeric material, or microwave absorbing ceramics. In an alternative embodiment, where the energy is from an infrared source, the absorbing piece may be made of materials that can strongly absorb the infrared energy such as infrared energy absorption glass, No. 3961 glass and No. 3962 glass.

As seen in FIG. 3, the absorbing piece 224 is in a block shape. However, in different embodiments, the absorbing piece 224 can take on any three dimensional shape except that the absorbing piece 224 must be less than the size of the supporting piece 222.

Figure 4A:
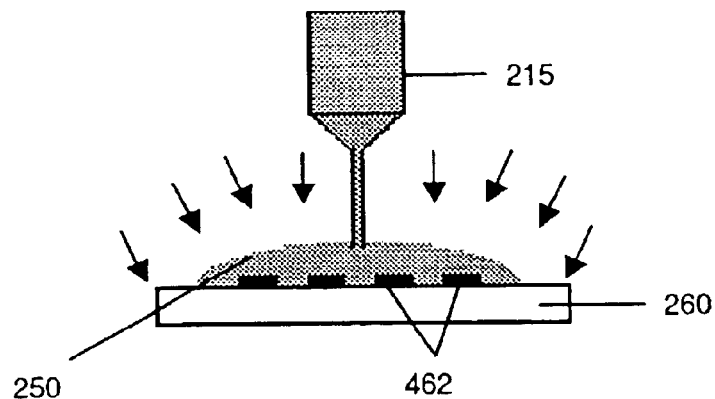
FIGS. 4a–4c are cross-sectional side views one embodiment of a flip chip involved in a no flow underfill process.
Figure 4B:
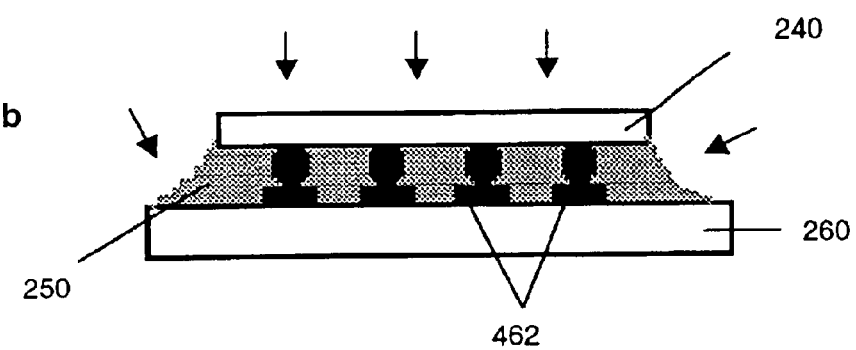
Figure 4C:
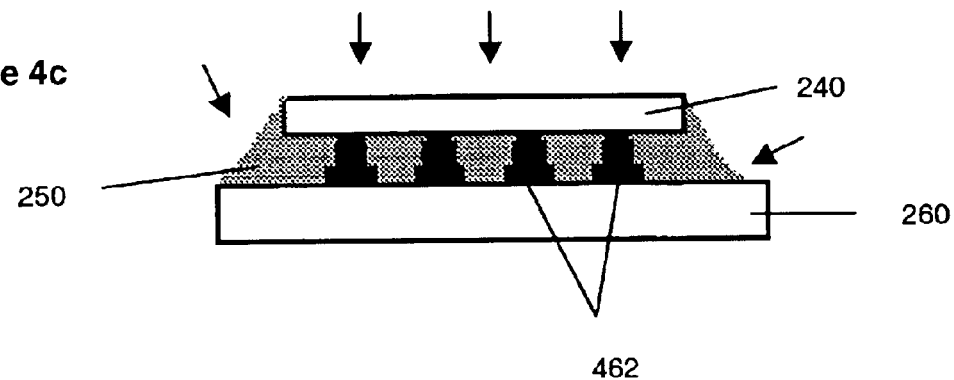

FIGS. 4a through 4c illustrate one embodiment of a flip chip involved in a no flow underfill process. In this process, and as seen in FIG. 4a, no flow underfill material 250 that has fluxing capability is placed on a substrate 260 with electrically conductive pads 462, or solder, in FIGS. 4a–4c and 662 in FIG. 6. In FIG. 4b, a chip 240 is then aligned and compressed down using a chip placement machine (not shown). The so prepared assembly needs bump reflow right before underfill cure to result in the finished flip chip assembly which is shown in FIG. 4c.

The key to make this process successful is how to control the transfer of energy so that the solder 462 reflow occurs before the no flow underfill material 250 gel. By using the guided heating apparatus shown in FIG. 2, the flip chip 240 and metal solder joint 462 can be selectively heated from the energy source 215 faster than the underfill material 250 by applying the intensive heat on the backside of the flip chip 240 using the absorbing piece. Since the flip chip 240 material (silicon) and solder 462 material have much better heat conductivity than no flow underfill material 250, and the solder 462 melting and wetting kinetics is faster than no flow underfill 250 gel kinetics, this is achievable by this simplified flip chip underfill process using the guided heating apparatus.

Figure 5:
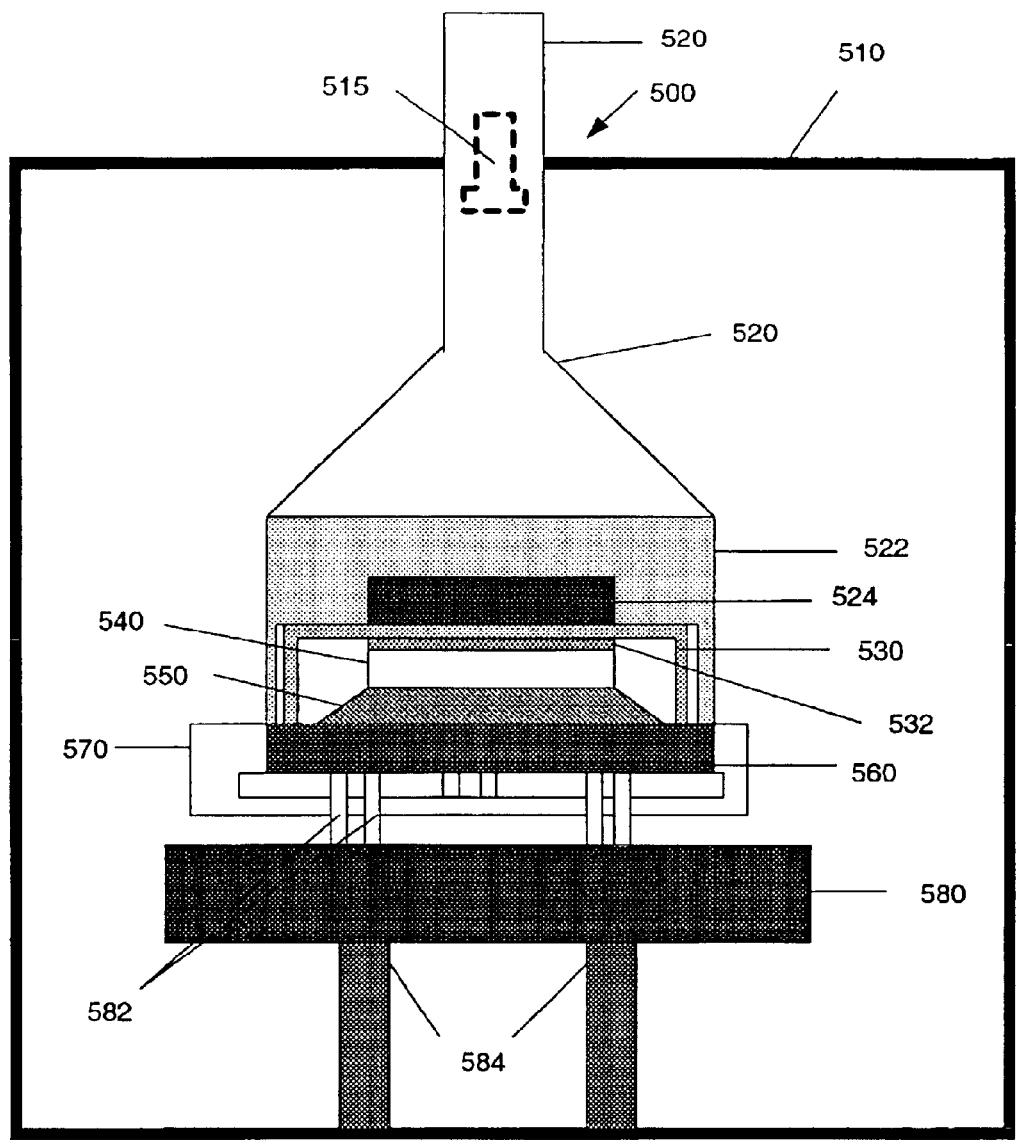
FIG. 5 is a cross-sectional side view of an alternative embodiment of a guided heating apparatus.

FIG. 5 illustrates an alternative embodiment of a guided heating apparatus 500. The guided heating apparatus 500 includes a chamber 510 having an energy source 515. The energy source is enclosed by a guiding enclosure 520 that guides and keeps energy from the energy source 515 within the guiding enclosure 520. The introduction of the guiding enclosure 520 prevents the dissemination of energy throughout the entirety of the chamber 510 thereby causing elements such as the sample holder 570, package metal pins 582, sample stage 580, and sample stage supports 584 from becoming unnecessarily heated from the energy. Rather, the guiding enclosure 520 guides the energy to a target area.

The guiding enclosure 520 is coupled to a supporting piece 522. An absorbing piece 524 is secured and supported by the supporting piece 522 within the guiding enclosure 520. Any number of objects may be heated directly or indirectly by being placed in the guiding enclosure 520 so that the energy from the energy source 515 is guided toward that object(s). Depending on the size of the object to be heated, there may be surface area of the object that is directly exposed to the energy. In addition, the object may be positioned and aligned with the absorbing piece 524 such that the absorbing piece transfers energy it absorbed from the energy source to the object. This type of scenario occurs when the absorbing piece is made of one or more materials that may absorb energy faster than the object.

In FIG. 5, there are several objects to be heated. One is underfill material 550 sandwiched between an IC chip 540 and a substrate 560. Another is TIM material 532 sandwiched between a heat sink 530 and the chip 540. Another material to be heated is sealant material sandwiched between each heat sink 530 leg and the substrate 560. In this type of application, the absorbing material absorbs the energy very quickly, and transfers the energy to the heat sink 530. The heat sink conducts the energy to the IC chip 540 and the substrate 560. The IC chip 540 then conducts the energy to the underfill material 550. At the same time, the side surfaces of the underfill material 550 will receive energy directly.

This type of guided heating apparatus 500 avoids heating other elements and provides greater control of heat towards one or more objects to be heated. One particular application where such a guided heating apparatus may be useful is a flip chip thermal management application. This type of application is discussed in more detail with reference to FIG. 6.

Figure 6:
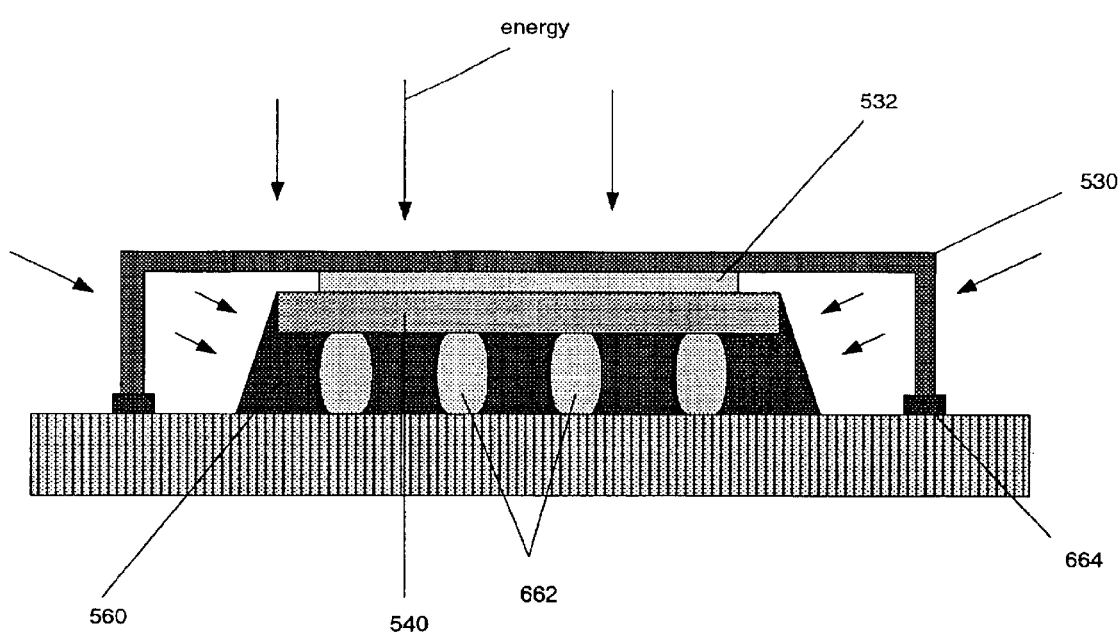
FIG. 6 are cross-sectional side views of one embodiment of a flip chip thermal management application.

FIG. 6 illustrates one embodiment of a flip chip thermal management application. This application is very similar to the no flow application discussed with reference to FIGS. 4a–4c. The TIM material 532 needs to be reflowed or cured right before heat sink sealant material gel 664. By using the guided heating apparatus of FIG. 5, the heat sink 530 and TIM material 532 can be selectively heated faster than the underfill material 550 by applying intensive heat on the backside of the heat sink 530 using the absorbing piece.

Achieving this simplified IHS making process using the guided heating apparatus is possible for many reasons. One reason is that the heat sink 530 material (commonly copper) and TIM material 532 (commonly solder) have much better heat conductivity than the no flow underfill material 550. Another reason is that solder melting and wetting kinetics is faster than no flow underfill gel kinetics. Accordingly, this simplified IHS making process is made possible using the guided heating apparatus.

Figure 7:
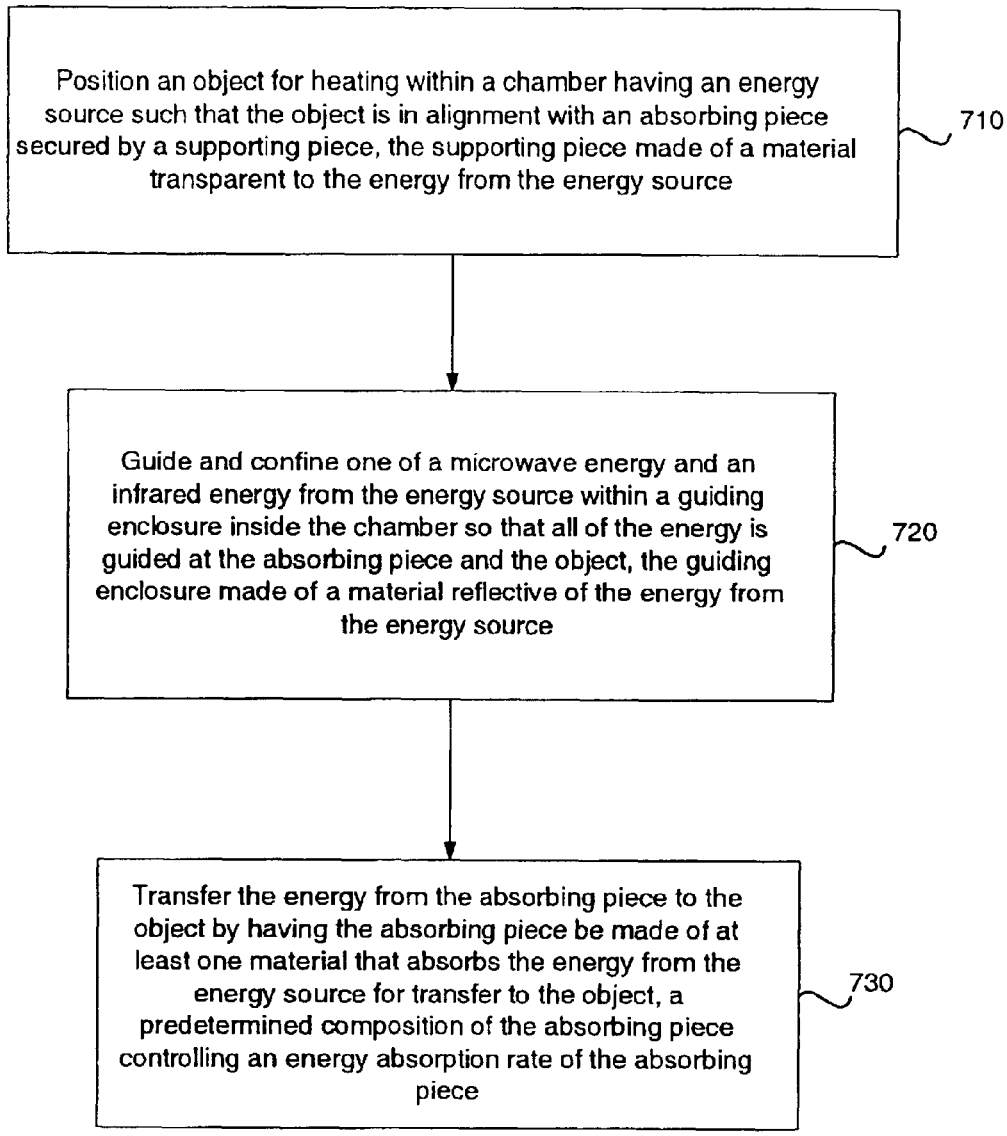
FIG. 7 is a flowchart of one embodiment of a process of heating an object.

FIG. 7 illustrates one embodiment of a process 700 of heating an object. At processing block 710, an object for heating is positioned within a chamber having an energy source such that the object is in alignment with an absorbing piece secured by a supporting piece. The supporting piece is made of a material transparent to the energy from the energy source.

At processing block 720, one of microwave energy or infrared energy from an energy source is guided and confined within a guiding enclosure inside the chamber so that all the energy is guided at the absorbing piece and the object. The guiding enclosure is made of a material reflective of the energy from the energy source.

At processing block 730, the energy is transferred from the absorbing piece to the object by having the absorbing piece be made of at least one material that absorbs the energy from the energy source for transfer to the object. The absorbing piece has a predetermined composition that controls an energy absorption rate of the absorbing piece.

A guided heating apparatus and a method for using the same have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. An apparatus comprising:

a guiding enclosure to guide and keep energy from an energy source within the guiding enclosure, the guiding enclosure made of a material reflective of the energy from the energy source, the energy source being an electromagnetic radiation source;

a supporting piece detachably coupled with the guiding enclosure, the supporting piece made of a material transparent to the energy from the energy source; and an absorbing piece coupled to and supported by the supporting piece within the guiding enclosure, the absorbing piece made of at least one material that absorbs the energy from the energy source and transfers the energy to an object to be heated, a predetermined composition of the absorbing piece controlling an energy absorption rate of the absorbing piece; and a holder with a top portion contacting a bottom portion of the guiding enclosure to keep the energy from the energy source within the guiding enclosure.

2. The apparatus of claim 1 wherein the predetermined composition of the absorbing piece includes the absorbing piece made of one material that uniformly absorbs the energy from the energy source.

3. The apparatus of claim 1 wherein the predetermined composition of the absorbing piece includes more than one material, each material capable of absorbing the energy from the energy source at a different absorption rate.

4. The apparatus of claim 1 wherein the energy source is a microwave source.

5. The apparatus of claim 4 wherein the guiding enclosure material is made of metal.

6. The apparatus of claim 4 wherein the supporting piece material is selected from the group consisting of microwave transparent ceramic and quartz.

7. The apparatus of claim 4 wherein the absorbing piece material is selected from the group consisting of silicon, carbon doped metal, and microwave absorbing ceramics.

8. The apparatus of claim 1 wherein the energy source is an infrared source and the supporting piece material is selected from the group consisting of quartz, potassium bromide, and infrared transparent glass.

9. The apparatus of claim 1 wherein the object to be heated includes a plurality of solder joints sandwiched between a substrate and a chip.

10. A The apparatus of claim 9 wherein the object to be heated further includes an underfill material surrounding the solder joints, the solder joints reflowing from the energy before the underfill material is cured by the energy.

11. The apparatus of claim 10 wherein the object to be heated further includes a material sandwiched between the chip and a heat sink on a side of the chip opposite of a side of the chip facing the substrate.

12. The apparatus of claim 11 wherein the object to be heated further includes a heat sink sealant material sandwiched between the heat sink and the substrate at two contact points where the heat sink contacts the substrate, the material cured by the energy before the heat sink sealant material gels from the energy.

13. The apparatus of claim 12 wherein the object to be heated further includes a material sandwiched between the heat sink and the chip.

14. An apparatus comprising:

a guide having an internal cavity, an end through which energy from an electromagnetic radiation source can enter the cavity, and a mouth on a side of the cavity opposing the end, the guide being made of a material reflective to the energy so that a majority of the energy is guided to the mouth;

a support piece secured over the mouth and being made of a material through which a first portion of the energy transmits; and an absorbing piece which absorbs a second portion of the energy through a first surface thereof facing into the cavity to cause heating thereof, the heat being transferred from a second surface thereof against which an object to be heated can be located, the absorbing piece having a predetermined composition that includes more than one material, each material capable of absorbing the energy at a different absorption rate.

15. The apparatus of claim 14 wherein the energy is from a microwave source.

16. An apparatus comprising:

a guiding enclosure to guide and keep energy from an energy source within the guiding enclosure, the guiding enclosure made of a material reflective of the energy from the energy source, the energy source being an electromagnetic radiation source;

a supporting piece detachably coupled with the guiding enclosure, the supporting piece made of a material transparent to the energy from the energy source; and an absorbing piece coupled to and supported by the supporting piece within the guiding enclosure, the absorbing piece made of at least one material that absorbs the energy from the energy source and transfers the energy to an object to be heated, a predetermined composition of the absorbing piece controlling an energy absorption rate of the holding piece and including more than one material, each material capable of absorbing the energy from the energy source at a different absorption rate.

* * * * *